United States Patent
Sakano et al.

(10) Patent No.: US 11,374,563 B2
(45) Date of Patent: Jun. 28, 2022

(54) METHOD FOR CONTROLLING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsunori Sakano, Shinagawa Tokyo (JP); Ryohei Gejo, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 13 days.

(21) Appl. No.: 17/012,839

(22) Filed: Sep. 4, 2020

(65) Prior Publication Data

US 2021/0281258 A1 Sep. 9, 2021

(30) Foreign Application Priority Data

Mar. 3, 2020 (JP) .............................. JP2020-036123
Sep. 1, 2020 (JP) .............................. JP2020-146992

(51) Int. Cl.
*H01L 29/08* (2006.01)
*H01L 29/739* (2006.01)
(Continued)

(52) U.S. Cl.
CPC ........ *H03K 17/168* (2013.01); *H01L 29/7397* (2013.01)

(58) Field of Classification Search
None
See application file for complete search history.

(56) References Cited

U.S. PATENT DOCUMENTS 7,075,168 B2 * 7/2006 Sugiyama ........... H01L 29/4232
257/107
9,515,067 B2 * 12/2016 Saikaku ................ H01L 29/407
(Continued)

FOREIGN PATENT DOCUMENTS

JP H6-140587 A 5/1994
JP H7-111324 A 4/1995
(Continued)

*Primary Examiner* — Kenneth B Wells
(74) *Attorney, Agent, or Firm* — Finnegan, Henderson, Farabow, Garrett & Dunner L.L.P.

(57) ABSTRACT

A semiconductor device includes first and second electrodes, a semiconductor part therebetween and first to third control electrodes between the first electrode and the semiconductor part. The semiconductor part includes first and third layers of a first-conductivity-type and second and fourth layers of a second-conductivity-type. The second, third and fourth layers are provided between the first layer and the first electrode, between the second layer and the first electrode, and between the first layer and the second electrode, respectively. To the first to third control electrodes, first to third voltages greater than the threshold voltage thereof are applied at first to third timings, respectively. The third, second and first voltages are reduced to a lower level than the threshold voltage at a fourth timing after the first to third timings, at a fifth timing after the fourth timing and at a sixth timing after the fifth timing, respectively.

13 Claims, 11 Drawing Sheets

(51) Int. Cl.
  *H01L 23/522* (2006.01)
  *H03K 17/16* (2006.01)

(56) References Cited

U.S. PATENT DOCUMENTS

| | | | | |
|---|---|---|---|---|
| 9,595,602 B2* | 3/2017 | Hashimoto | ....... | H01L 29/41708 |
| 10,186,608 B2* | 1/2019 | Naito | ................. | H01L 29/0834 |
| 10,811,524 B2* | 10/2020 | Iwakaji | ............... | H01L 29/0623 |
| 10,985,268 B2* | 4/2021 | Matsudai | ............ | H01L 29/083 |
| 11,101,375 B2* | 8/2021 | Matsudai | ............ | H01L 29/7397 |
| 2019/0296134 A1 | 9/2019 | Matsudai et al. | | |

FOREIGN PATENT DOCUMENTS

| | | | |
|---|---|---|---|
| JP | 2019-145758 A | 8/2019 |
| JP | 2019-161720 A | 9/2019 |
| JP | 2019-169575 | 10/2019 |

\* cited by examiner

METHOD FOR CONTROLLING SEMICONDUCTOR DEVICE

CROSS-REFERENCE TO RELATED APPLICATIONS

This application is based upon and claims the benefit of priority from Japanese Patent Application No. 2020-036123, filed on Mar. 3, 2020, and Japanese Patent Application No. 2020-146992, filed on Sep. 1, 2020; the entire contents of all of which are incorporated herein by reference.

FIELD

Embodiments relate to a method for controlling a semiconductor device.

BACKGROUND

It is desirable to reduce the on-resistance and the switching loss of a power control semiconductor device.

DETAILED DESCRIPTION

Figure 1:
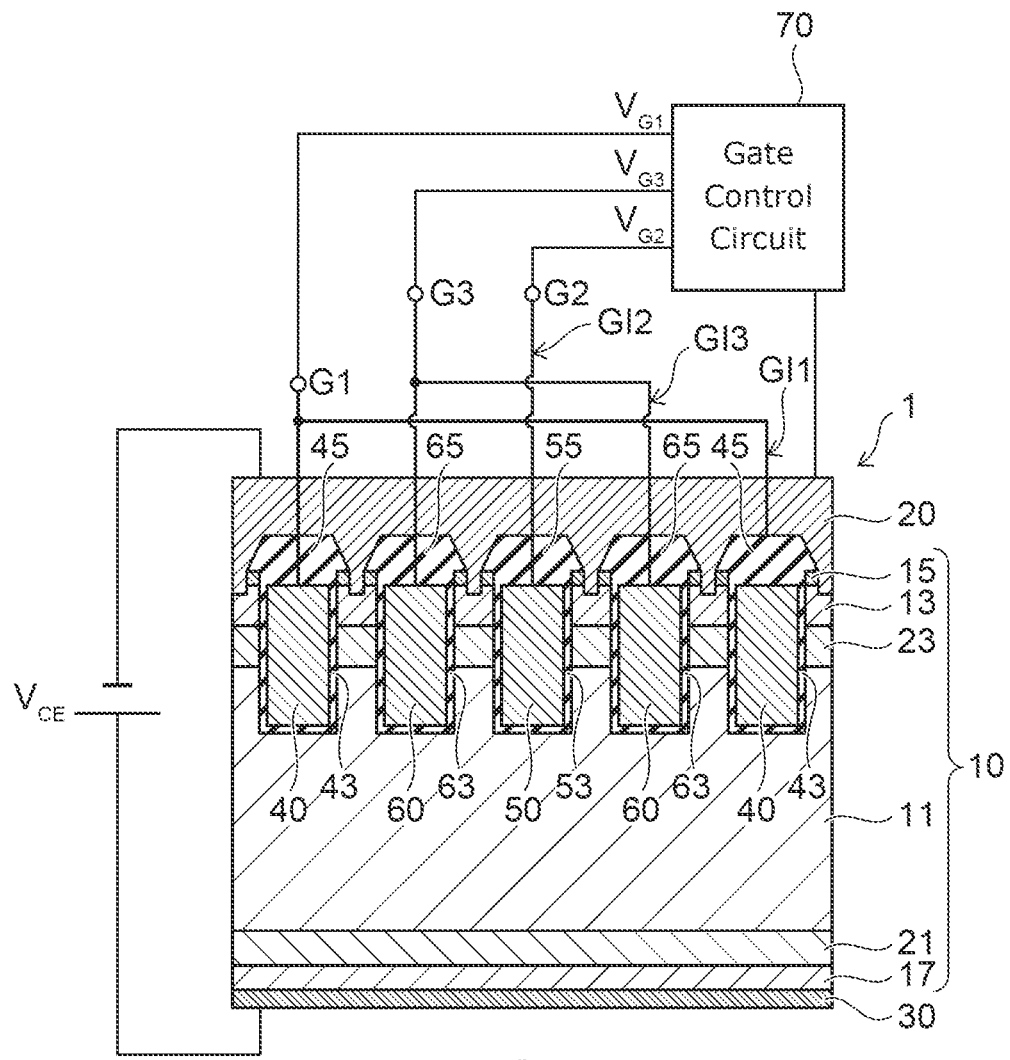
FIG. 1 is a schematic view showing a semiconductor device according to a first embodiment.

According to one embodiment, the semiconductor device includes a first electrode; a second electrode facing the first electrode; a semiconductor part provided between the first electrode and the second electrode; and first to third control electrodes provided between the semiconductor part and the first electrode. The first to third control electrodes are electrically insulated from the semiconductor part and the first electrode and electrically isolated from each other. The semiconductor part includes a first layer of a first conductivity type, a second layer of a second conductivity type, a third layer of the first conductivity type, and a fourth layer of the second conductivity type. The first to third control electrodes extend in the first layer from a front surface side of the semiconductor part. The second layer is provided between the first layer and the first electrode. The third layer is selectively provided between the second layer and the first electrode, the third layer being electrically connected to the first electrode. The fourth layer is provided between the first layer and the second electrode, the fourth layer being electrically connected to the second electrode. The method for controlling the semiconductor device includes applying a first control voltage between the first control electrode and the first electrode, the first control voltage being a first-off voltage that is less than a first threshold voltage of the first control electrode; applying a second control voltage between the second control electrode and the first electrode, the second control voltage being a second off-voltage that is less than a second threshold voltage of the second control electrode; applying a third control voltage between the third control electrode and the first electrode, the third control voltage being a third off-voltage that is less than a third threshold voltage of the third control electrode; increasing the first control voltage from the first off-voltage to a first on-voltage at a first timing, the first on-voltage being greater than the first threshold voltage; increasing the second control voltage from the second off-voltage to a second on-voltage at a second timing, the second on-voltage being greater than the second threshold voltage; increasing the third control voltage from the third off-voltage to a third on-voltage at a third timing, the third on-voltage being greater than the third threshold voltage; reducing the third control voltage from the third on-voltage to a lower level than the third threshold voltage at a fourth timing after the first to third timings; reducing the second control voltage from the second on-voltage to a lower level than the second threshold voltage at a fifth timing after the fourth timing; and reducing the first control voltage from the first on-voltage to a lower level than the first threshold voltage at a sixth timing after the fifth timing.

Embodiments will now be described with reference to the drawings. The same portions inside the drawings are marked with the same numerals; a detailed description is omitted as appropriate; and the different portions are described. The drawings are schematic and conceptual; and the relationships between the thicknesses and widths of portions, the proportions of sizes among portions, etc., are not necessarily the same as the actual values. The dimensions and/or the proportions may be illustrated differently between the drawings, even in the case where the same portion is illustrated.

First Embodiment

FIG. 1 is a schematic view showing a semiconductor device 1 according to a first embodiment. The semiconductor device 1 is, for example, an IGBT (Insulated Gate Bipolar Transistor).

As shown in FIG. 1, the semiconductor device 1 includes a semiconductor part 10, a first electrode 20, a second electrode 30, a first control electrode 40, a second control electrode 50, and a third control electrode 60.

The semiconductor part 10 is provided between the first electrode 20 and the second electrode 30. The semiconductor part 10 is, for example, silicon. The first electrode 20 is, for example, an emitter electrode. The second electrode 30 is, for example, a collector electrode. The first electrode 20 and the second electrode 30 are, for example, metal layers including aluminum, titanium, etc.

The first control electrode 40, the second control electrode 50, and the third control electrode 60 are provided between the semiconductor part 10 and the first electrode 20 and are electrically isolated from each other. The first control electrode 40, the second control electrode 50, and the third control electrode 60 extend in the semiconductor part 10 and are disposed respectively inside trenches provided in the semiconductor part 10.

The first control electrode 40 is electrically insulated from the semiconductor part 10 by a first insulating film 43. The second control electrode 50 is electrically insulated from the semiconductor part 10 by a second insulating film 53. The third control electrode 60 is electrically insulated from the semiconductor part 10 by a third insulating film 63. Also, the first control electrode 40, the second control electrode 50, and the third control electrode 60 are electrically insulated from the first electrode 20 respectively by inter-layer insulating films 45, 55, and 65.

The semiconductor part 10 includes a first layer 11 of a first conductivity type, a second layer 13 of a second conductivity type, a third layer 15 of the first conductivity type, and a fourth layer 17 of the second conductivity type. Hereinbelow, the first conductivity type is described as an n-type, and the second conductivity type is described as a p-type.

The first control electrode 40, the second control electrode 50, and the third control electrode 60 each extend in the first layer 11 from the front surface side of the semiconductor part 10. The first layer 11 is, for example, an n-type base layer.

The second layer 13 is provided between the first layer 11 and the first electrode 20. The second layer 13 includes a portion facing the first control electrode 40 via the first insulating film 43. The second layer 13 includes a portion facing the second control electrode 50 via the second insulating film 53. The second layer 13 includes a portion facing the third control electrode 60 via the third insulating film 63. The second layer 13 is, for example, a p-type base layer. The first insulating film 43, the second insulating film 53, and the third insulating film 63 each function as gate insulating films.

The third layer 15 is selectively provided between the second layer 13 and the first electrode 20 and is electrically connected to the first electrode 20. The third layer 15 is, for example, an n-type emitter layer. A plurality of the third layers 15 is provided and is disposed at positions respectively contacting the first insulating film 43, the second insulating film 53, and the third insulating film 63.

The fourth layer 17 is provided between the first layer 11 and the second electrode 30 and is electrically connected to the second electrode 30. The fourth layer 17 is, for example, a p-type collector layer.

The semiconductor part 10 further includes a fifth layer 21 of the first conductivity type and a sixth layer 23 of the first conductivity type.

The fifth layer 21 is provided between the first layer 11 and the fourth layer 17. The fifth layer 21 is, for example, an n-type buffer layer and includes a first-conductivity-type impurity with a higher concentration than the first-conductivity-type impurity of the first layer 11.

The sixth layer 23 is provided between the first layer 11 and the second layer 13. The sixth layer 23 is, for example, an n-type barrier layer and includes a first-conductivity-type impurity with a higher concentration than the first-conductivity-type impurity of the first layer 11. Also, the first-conductivity-type impurity of the sixth layer 23 has a lower concentration than the first-conductivity-type impurity of the third layer 15.

FIG. 1 illustrates a voltage $V_{CE}$ applied between the first electrode 20 and the second electrode 30, a first control voltage $V_{G1}$ applied between the first control electrode 40 and the first electrode 20, a second control voltage $V_{G2}$ applied between the second control electrode 50 and the first electrode 20, and a third control voltage $V_{G3}$ applied between the third control electrode 60 and the first electrode 20.

When operating the semiconductor device 1, for example, the first electrode 20 is maintained at a lower potential than the potential of the second electrode 30 by the voltage $V_{CE}$.

The first control voltage $V_{G1}$ is applied from a gate control circuit 70 to the first control electrode 40 via a gate terminal G1 and a gate interconnect GI1. For example, the first control electrode 40 has a first threshold voltage determined by the film thickness of the first insulating film 43 and the concentration of second-conductivity-type carriers (hereinbelow, holes) in the second layer 13.

The second control voltage $V_{G2}$ is applied from the gate control circuit 70 to the second control electrode 50 via a gate terminal G2 and a gate interconnect GI2. For example, the second control electrode 50 has a second threshold voltage determined by the hole concentration of the second layer 13 and the film thickness of the second insulating film 53.

The third control voltage $V_{G3}$ is applied from the gate control circuit 70 to the third control electrode 60 via a gate terminal G3 and a gate interconnect GI3. For example, the third control electrode 60 has a third threshold voltage determined by the hole concentration of the second layer 13 and the film thickness of the third insulating film 63.

Figure 2:
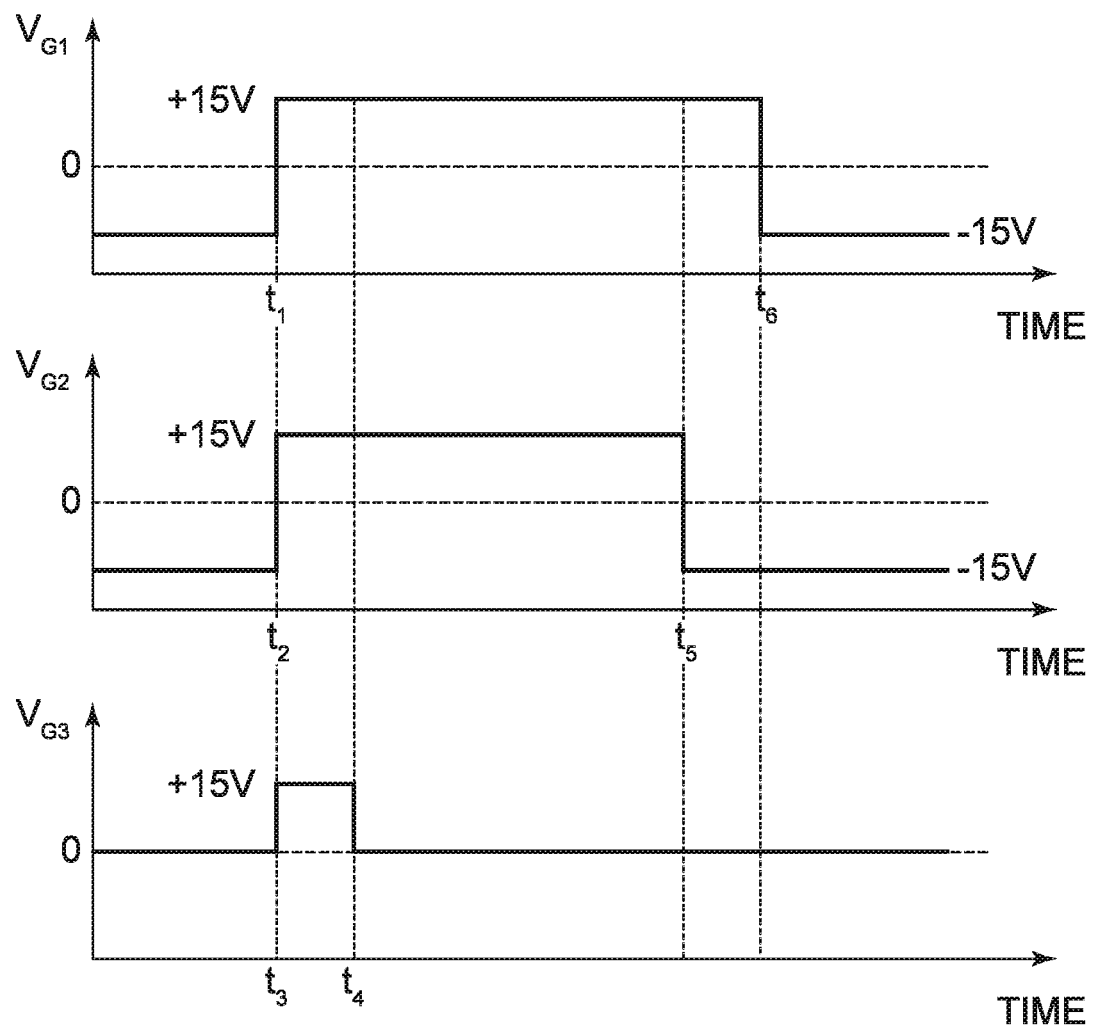
FIG. 2 is a time chart showing a method for controlling the semiconductor device according to the first embodiment.

FIG. 2 is a time chart showing a method for controlling the semiconductor device 1 according to the first embodiment. FIG. 2 shows the method for controlling the semiconductor device 1 for first to sixth timings $t_1$ to $t_6$. For example, the semiconductor device 1 is turned on at the first timing $t_1$ and is turned off at the sixth timing $t_6$. The first electrode 20 is maintained at a lower potential than the potential of the second electrode 30 between the first timing $t_1$ and the sixth timing $t_6$. The first to third threshold voltages are equal. This is similar in the following examples as well. "Equal" is not limited to an exact meaning of equal and is, for example, a concept including slight differences in the actual circuit operation.

In the turn-on process of the semiconductor device 1 as shown in FIG. 2, for example, at the first timing $t_1$, the first control voltage $V_{G1}$ is increased from a first off-voltage that is less than the first threshold voltage to an on-voltage that is greater than the first threshold voltage.

At the second timing $t_2$, the second control voltage $V_{G2}$ is increased from a second off-voltage that is less than the second threshold voltage to a second on-voltage that is greater than the second threshold voltage.

At the third timing $t_3$, the third control voltage $V_{G3}$ is increased from a third off-voltage that is less than the third threshold voltage to a third on-voltage that is greater than the third threshold voltage. At the fourth timing $t_4$ which is after the first timing $t_1$, the second timing $t_2$, and the third timing $t_3$, the third control voltage $V_{G3}$ is reduced to a level (e.g., the third off-voltage) that is less than the third threshold voltage.

In the example, the first timing $t_1$, the second timing $t_2$, and the third timing $t_3$ are simultaneous. The first off-voltage and the second off-voltage are the same voltage, e.g., negative 15 V. The third off-voltage is, for example, 0 V. The first on-voltage, the second on-voltage, and the third on-voltage are the same voltage, e.g., positive 15 V. The embodiment is not limited to the example; for example, the first timing $t_1$, the second timing $t_2$, and the third timing $t_3$ may be set to be different.

In the turn-off process of the semiconductor device 1, the second control voltage $V_{G2}$ is reduced to a level (e.g., the second off-voltage) that is less than the second threshold voltage at the fifth timing $t_5$, which is after the fourth timing $t_4$. Continuing, at the sixth timing $t_6$ which is after the fifth timing $t_5$, the first control voltage $V_{G1}$ is reduced to a level (e.g., the first off-voltage) that is less than the first threshold voltage.

The period between the second timing $t_2$ and the fifth timing $t_5$ is, for example, longer than the period between the fifth timing $t_5$ and the sixth timing $t_6$. The period between the fourth timing $t_4$ and the fifth timing $t_5$ is, for example, longer than the period between the fifth timing $t_5$ and the sixth timing $t_6$.

Figure 3A:
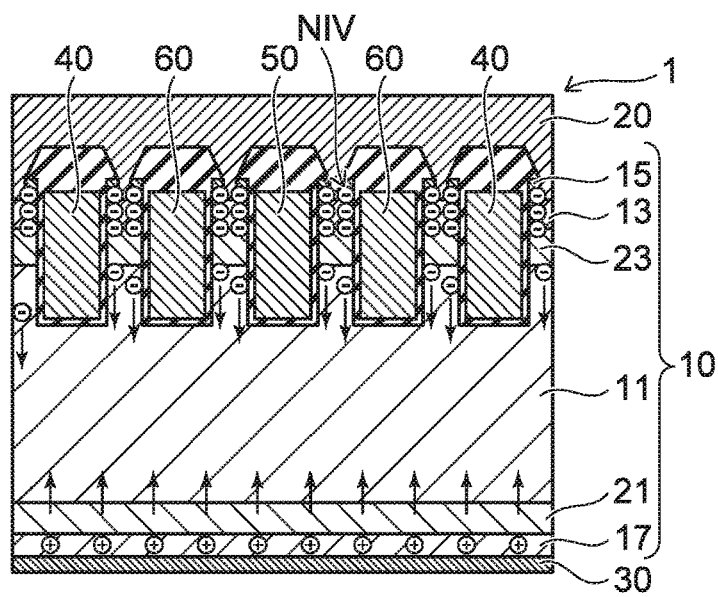
FIGS. 3A to 3C are schematic cross-sectional views showing the method for controlling the semiconductor device according to the first embodiment.
Figure 3B:
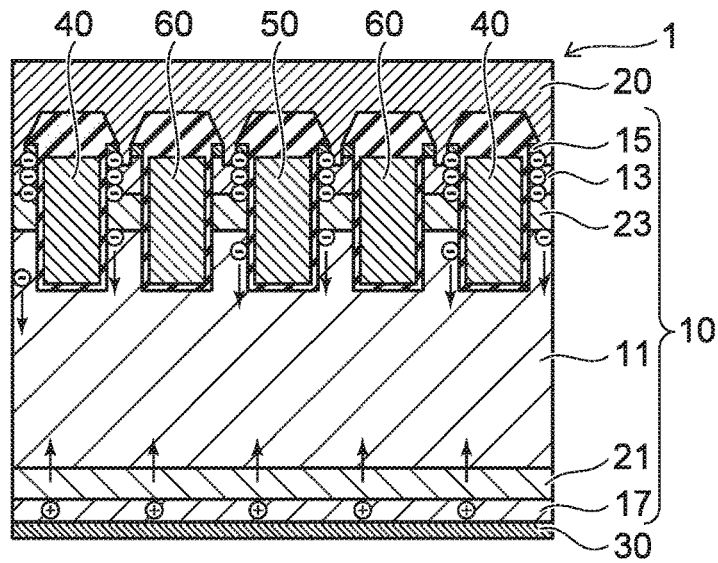
Figure 3C:
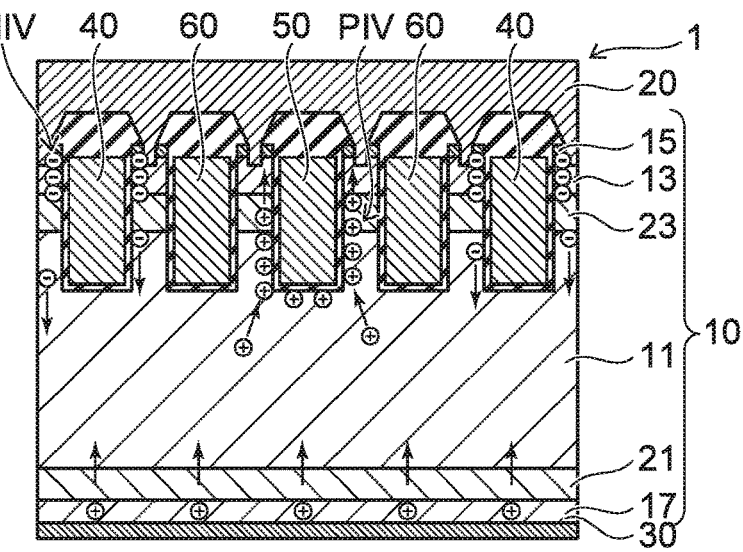

FIGS. 3A to 3C are schematic cross-sectional views showing the method for controlling the semiconductor device 1 according to the first embodiment. FIGS. 3A to 3C are schematic views showing the movement of the carriers (the electrons and the holes) in the semiconductor part 10 at the first to sixth timings $t_1$ to $t_6$.

FIG. 3A illustrates the movement of the carriers in the period between the third timing $t_3$ and the fourth timing $t_4$. For example, on-voltages that are greater than the respective threshold voltages are applied respectively to the first control electrode 40, the second control electrode 50, and the third control electrode 60. Thereby, first-conductivity-type inversion layers NIV are induced respectively between the second layer 13 and the first insulating film 43, between the second layer 13 and the second insulating film 53, and between the second layer 13 and the third insulating film 63.

In the period between the third timing $t_3$ and the fourth timing $t_4$ as shown in FIG. 3A, electrons are injected from the first electrode 20 into the first layer 11 via the third layer 15, the inversion layers NIV, and the sixth layer 23. Accordingly, holes are injected from the fourth layer 17 into the first layer 11 via the fifth layer 21.

FIG. 3B illustrates the movement of the carriers in the period between the fourth timing $t_4$ and the fifth timing $t_5$. In this period, the third control voltage $V_{G3}$ that is applied to the third control electrode 60 is reduced to an off-voltage, e.g., 0 V. Therefore, the inversion layer NIV that is induced at the interface between the second layer 13 and the gate insulating film (the third insulating film 63) of the third control electrode 60 disappears, and the electron injection via the inversion layer NIV induced by the third control electrode 60 is stopped. As a result, the semiconductor device 1 is set to a prescribed on-state.

In other words, by applying the on-voltage to the third control electrode 60 in addition to the first and second control electrodes 40 and 50 in the period between the third timing $t_3$ and the fourth timing $t_4$, the electron injection into the first layer 11 is increased, and the carrier density in the first layer 11 is increased in a short period of time. Thereby, the time for the semiconductor device 1 to transition to the prescribed turned-on state can be reduced, and the turn-on loss can be reduced.

FIG. 3C is a schematic view showing the movement of the carriers in the semiconductor part 10 in the period between the fifth timing $t_5$ and the sixth timing $t_6$. In this period, in addition to the third control electrode 60, the second control voltage $V_{G2}$ that is applied to the second control electrode 50 is reduced to the off-voltage. Therefore, the inversion layer NIV that is induced at the interface between the second layer 13 and the gate insulating film (the second insulating film 53) of the second control electrode 50 disappears, and the electron injection via the inversion layer NIV induced by the second control electrode 50 is stopped.

The second control voltage $V_{G2}$ is reduced to an off-voltage, e.g., negative 15 V that is a lower level than the off-voltage of the third control voltage $V_{G3}$. Thereby, a second-conductivity-type accumulation layer PIV is induced at the interface between the first layer 11 and the gate insulating film (the second insulating film 53) of the second control electrode 50 and the interface between the second insulating film 53 and the sixth layer 23. Thereby, the holes in the first layer 11 are ejected to the first electrode 20 via the accumulation layer PIV and the second layer 13. In other words, the ejection of the holes from the first layer 11 due to the second-conductivity-type accumulation layer PIV is promoted, and the carrier density in the first layer 11 becomes less than that of the on-state between the fourth timing $t_4$ and the fifth timing $t_5$.

Subsequently, at the sixth timing $t_6$, the first control voltage $V_{G1}$ that is applied to the first control electrode 40 is reduced to an off-voltage, e.g., negative 15 V, and the first-conductivity-type inversion layer NIV that is induced at the interface between the second layer 13 and the gate insulating film (the first insulating film 43) of the first control electrode 40 disappears. Thereby, the electron injection from the first electrode 20 into the first layer 11 is completely stopped, and the carriers in the first layer 11 are ejected to the first and second electrodes 20 and 30. The semiconductor device 1 is set to the off-state when all of the carriers in the first layer 11 are ejected and the first layer 11 is depleted.

In the turn-off process described above, the turn-off time from the sixth timing $t_6$ until the first layer 11 is depleted can be reduced by pre-reducing the carrier density in the first layer 11 in the period between the fifth timing $t_5$ and the sixth timing $t_6$. The turn-off loss of the semiconductor device 1 can be reduced thereby.

Thus, in the semiconductor device 1 of the embodiment, the turn-off loss can be reduced by the control of the second control electrode 50, and the turn-on loss can be reduced by the control of the third control electrode 60.

Figure 4:
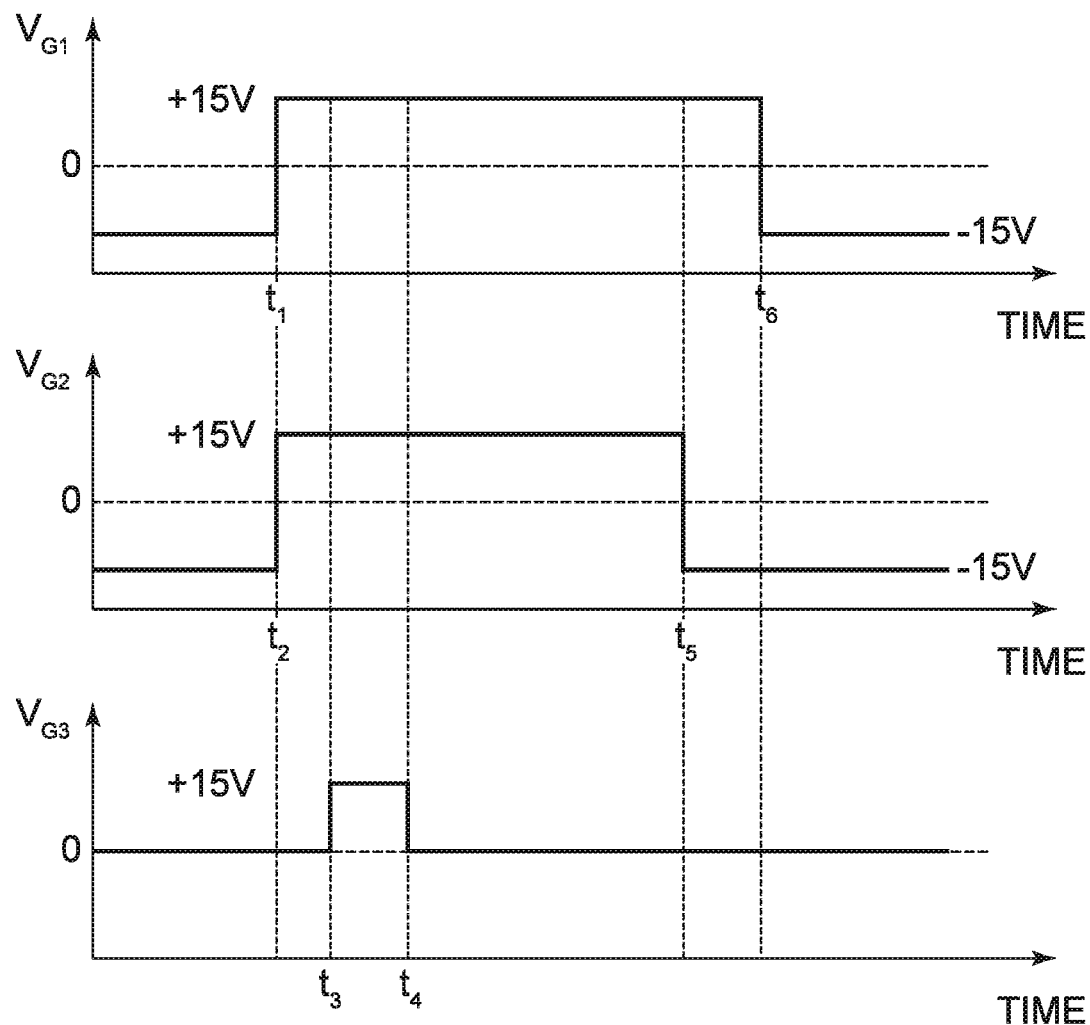
FIG. 4 is a time chart showing a method for controlling the semiconductor device 1 according to a modification of the first embodiment.

FIG. 4 is a time chart showing a method for controlling the semiconductor device 1 according to a modification of the first embodiment. In the control method shown in FIG. 4, the first timing $t_1$ and the second timing $t_2$ are simultaneous, and the third timing $t_3$ is set to be after the first and second timings $t_1$ and $t_2$.

In other words, on-voltages are applied simultaneously to the first and second control electrodes 40 and 50, and an on-voltage is applied to the third control electrode 60 after the application to the first and second control electrodes 40 and 50. The on-voltages that are applied to the first control electrode 40, the second control electrode 50, and the third control electrode 60 are, for example, positive 15 V.

Figure 5:
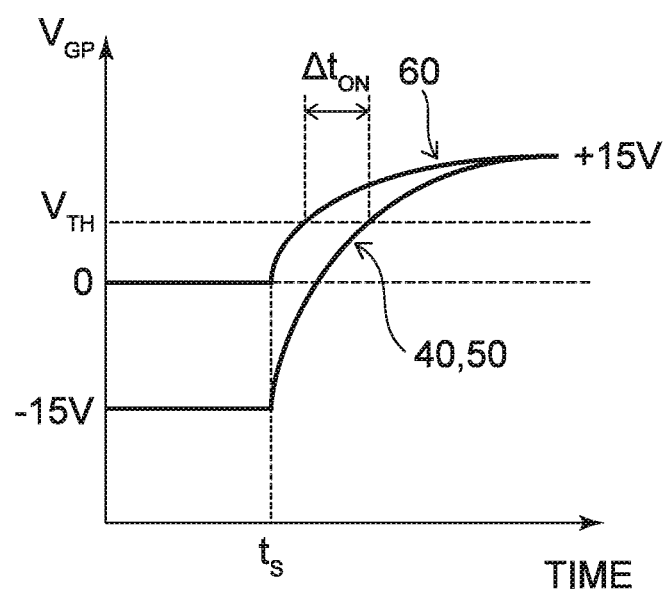
FIG. 5 is a schematic view showing a method for controlling the semiconductor device according to a modification of the first embodiment.

FIG. 5 is a schematic view showing a method for controlling the semiconductor device 1 according to a modification of the first embodiment. FIG. 5 is a schematic view showing the temporal change of a potential $V_{GP}$ of the first control electrode 40, the second control electrode 50, and the third control electrode 60. The potential of the first electrode 20 is 0 V.

For example, at a time $t_s$, the first control voltage $V_{G1}$ and the second control voltage $V_{G2}$ are applied, and the potentials of the first and second control electrodes 40 and 50 are increased from negative 15 V to positive 15 V. Also, at the time $t_5$, the third control voltage $V_{G3}$ is applied to the third control electrode 60, and the potential of the third control electrode 60 is increased from 0 V to positive 15 V. In such a case, the parasitic capacitances are equal between the first electrode 20 and the first, second, and third control electrodes 40, 50, and 60.

As shown in FIG. 5, the potentials of the first and second control electrodes 40 and 50 increase over time from negative 15 V to positive 15 V, which is greater than a threshold voltage $V_{TH}$. The potential of the third control electrode 60 increases from 0 V to positive 15 V, which is greater than the threshold voltage $V_{TH}$. In such a case, the potential of the third control electrode 60 reaches the threshold voltage $V_{TH}$ faster than the potentials of the first and second control electrodes 40 and 50.

In other words, due to the difference between the on-voltage and the off-voltage being different, for example, the potential of the third control electrode 60 reaches the threshold voltage $V_{TH}$ $\Delta t_{ON}$ faster than the potentials of the first and second control electrodes 40 and 50.

For example, to reduce the turn-on loss of the semiconductor device 1, it is favorable for the potentials of the first control electrode 40, the second control electrode 50, and the third control electrode 60 to simultaneously reach the threshold voltage $V_{TH}$.

In the control method shown in FIG. 4, the potential of the third control electrode 60 is controlled to reach the threshold voltage $V_{TH}$ simultaneously with the potentials of the first and second control electrodes 40 and 50 by delaying the third timing $t_3$ to be $\Delta t_{ON}$ later than the first timing $t_1$ and the second timing $t_2$. Thereby, the turn-on time can be reduced, and the turn-on loss can be reduced.

Figure 6A:
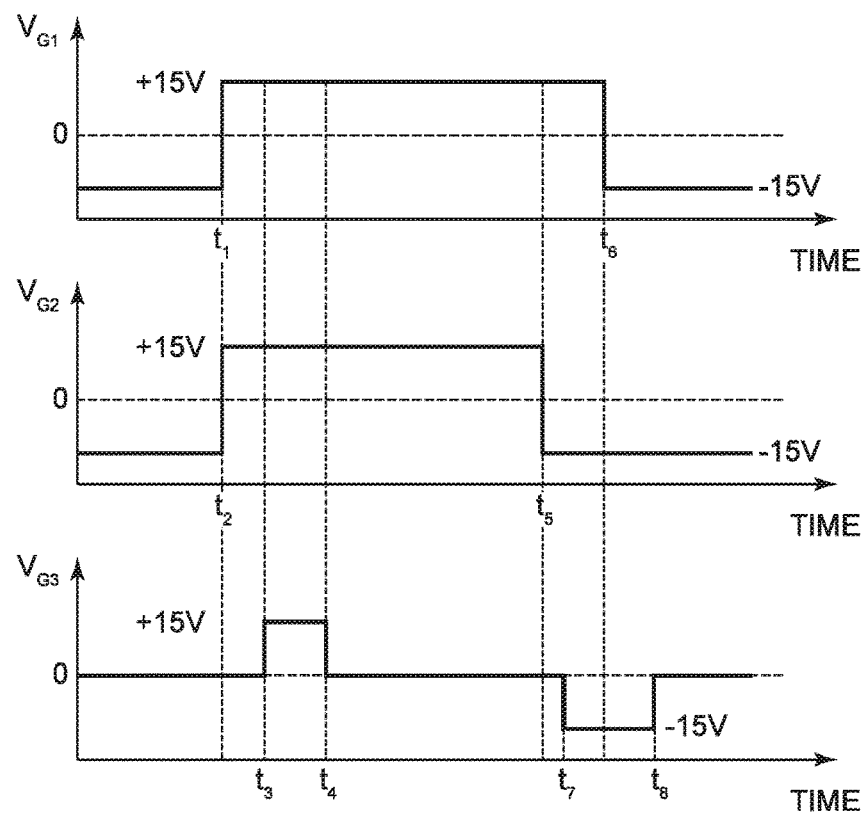
FIGS. 6A and 6B are time charts showing a method for controlling the semiconductor device 1 according to another modification of the first embodiment.
Figure 6B:
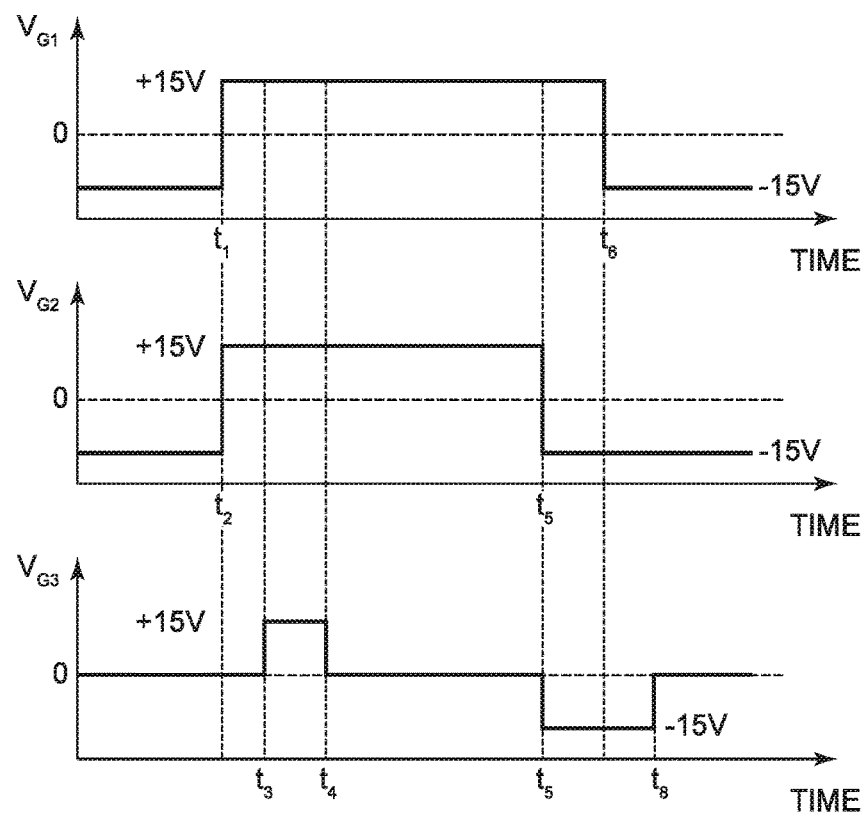

FIGS. 6A and 6B are time charts each showing a method for controlling the semiconductor device 1 according to another modification of the first embodiment. In the control methods shown in FIGS. 6A and 6B, similarly to the method for controlling FIG. 4, the potential of the third control electrode 60 is controlled to reach the threshold voltage $V_{TH}$ simultaneously with the potentials of the first and second control electrodes 40 and 50 by delaying the third timing $t_3$ to be $\Delta t_{ON}$ later than the first timing $t_1$ and the second timing $t_2$.

In the control method shown in FIG. 6A, the second control voltage $V_{G2}$ is reduced from positive 15 V to negative 15 V at the fifth timing $t_5$; subsequently, the third control voltage $V_{G3}$ is reduced to a level, e.g., negative 15 V that is less than the third off-voltage (e.g., 0 V) at a seventh timing $t_7$, which is between the fifth timing $t_5$ and the sixth timing $t_6$.

Continuing, the first control voltage $V_{G1}$ is reduced from positive 15 V to negative 15 V at the sixth timing $t_6$; subsequently, the third control voltage $V_{G3}$ is returned to the third off-voltage (e.g., 0 V) at an eighth timing $t_8$. The eighth timing $t_8$ is a timing after the semiconductor device 1 has transitioned to the off-state.

In the example, the turn-on loss is reduced by controlling the potentials of the first control electrode 40, the second control electrode 50, and the third control electrode 60 to simultaneously reach the threshold voltage $V_{TH}$ at turn-on. In the turn-off process, the ejection of the holes from the first layer 11 is promoted by inducing the accumulation layers PIV of the second conductivity type at the interface between the first layer 11 and the gate insulating film (the third insulating film 63) of the third control electrode 60 and the interface between the third insulating film 63 and the sixth layer 23 by reducing the third control voltage $V_{G3}$ to negative 15 V. The turn-off loss can be further reduced thereby.

In the example shown in FIG. 6B, at the fifth timing $t_5$, the third control voltage $V_{G3}$ is reduced to a level less than the third off-voltage (e.g., 0 V). In this case, the potential of the third control electrode 60 reaches a level that induces the second-conductivity-type accumulation layer PIV faster than the potential of the second control electrode 50. Although the ejection of the holes starts at an earlier timing at the third control electrode 60, the turn-off loss is less than that of the control method shown in FIG. 4.

Figure 7:
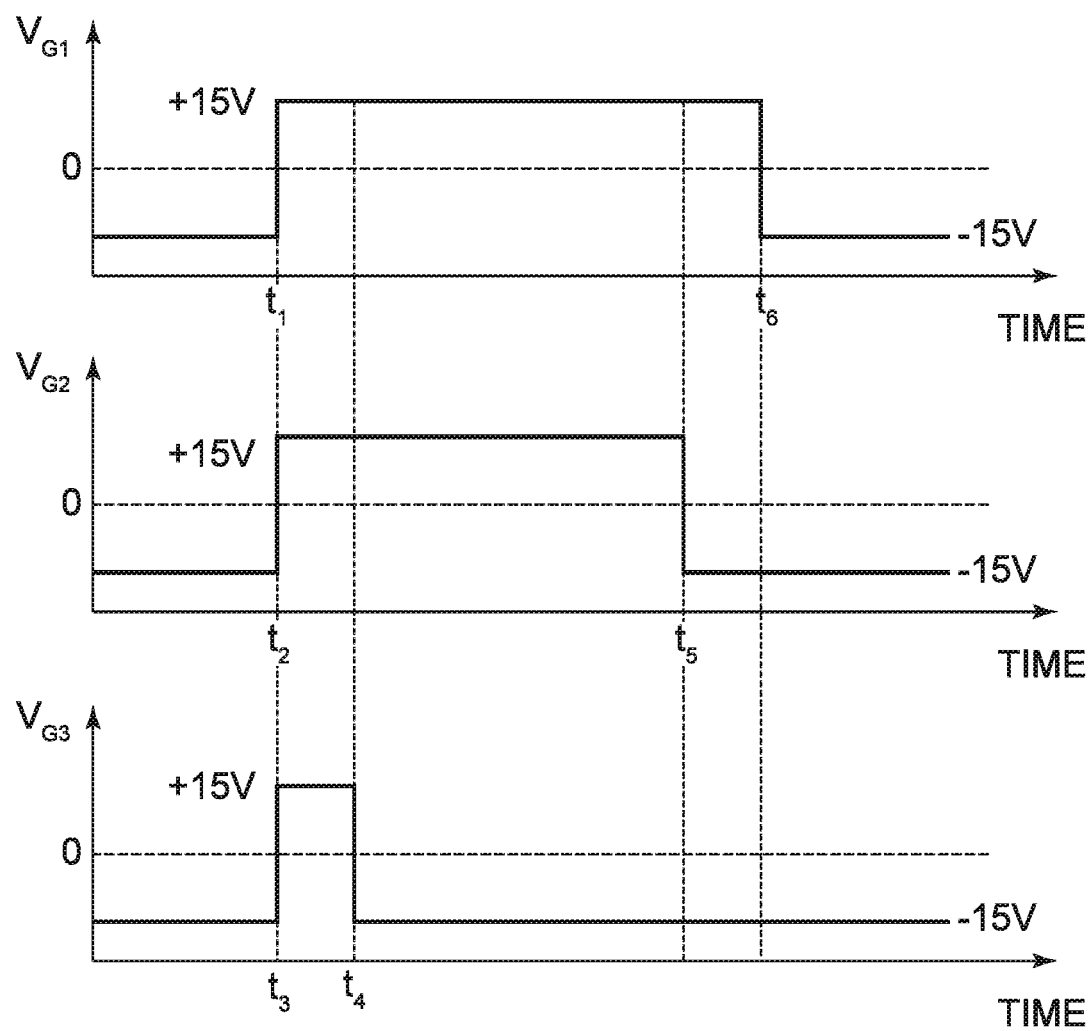
FIG. 7 is a time chart showing a method for controlling the semiconductor device according to another modification of the first embodiment.

FIG. 7 is a time chart showing a method for controlling the semiconductor device 1 according to another modification of the first embodiment. In the control method shown in FIG. 7, the third control voltage $V_{G3}$ also is increased from negative 15 V to positive 15 V at the third timing $t_3$ as are the first control voltage $V_{G1}$ and the second control voltage $V_{G2}$. Also, the third control voltage $V_{G3}$ is reduced from positive 15 V to negative 15 V at the fourth timing $t_4$. Accordingly, the third timing $t_3$ is set to be simultaneous with the first timing $t_1$ and the second timing $t_2$.

Thus, it is favorable for the first timing $t_1$, the second timing $t_2$, and the third timing $t_3$ to be set so that the potentials of the first control electrode 40, the second control electrode 50, and the third control electrode 60 simultaneously reach the threshold voltage $V_{TH}$.

The embodiment is not limited to the example described above; it is desirable for the first timing $t_1$, the second timing $t_2$, and the third timing $t_3$ to be set so that, for example, the potentials of the first to third control electrodes 40, 50, and 60 simultaneously reach the respective threshold voltages based on the difference between the on-voltage and the off-voltage for each of the first to third control voltages $V_{G1}$, $V_{G2}$, and $V_{G3}$ and the parasitic capacitances between the first electrode 20 and each of the first to third control electrodes 40, 50, and 60.

In the control method shown in FIG. 2, the first timing $t_1$, the second timing $t_2$, and the third timing $t_3$ are set to be simultaneous regardless of the difference between the on-voltage and the off-voltage being smaller for the third control voltage $V_{G3}$ than for the first control voltage $V_{G1}$ and the second control voltage $V_{G2}$. In such a case, for example, the parasitic capacitance between the first electrode 20 and the third control electrode 60 is greater than the parasitic capacitance between the first electrode 20 and the first control electrode 40 and the parasitic capacitance between the first electrode 20 and the second control electrode 50. Therefore, $\Delta t_{ON}$ shown in FIG. 5 cancels with the delay of the rise time of the potential caused by the parasitic capacitance of the third control electrode 60.

Even if the difference between the on-voltage and the off-voltage is equal between the first to third control voltages $V_{G1}$, $V_{G2}$, and $V_{G3}$, there are also cases where the first timing $t_1$, the second timing $t_2$, and the third timing $t_3$ are set to be different from each other if the parasitic capacitances between the first electrode 20 and each of the first to third control electrodes 40, 50, and 60 are different from each other.

Second Embodiment

Figure 8:
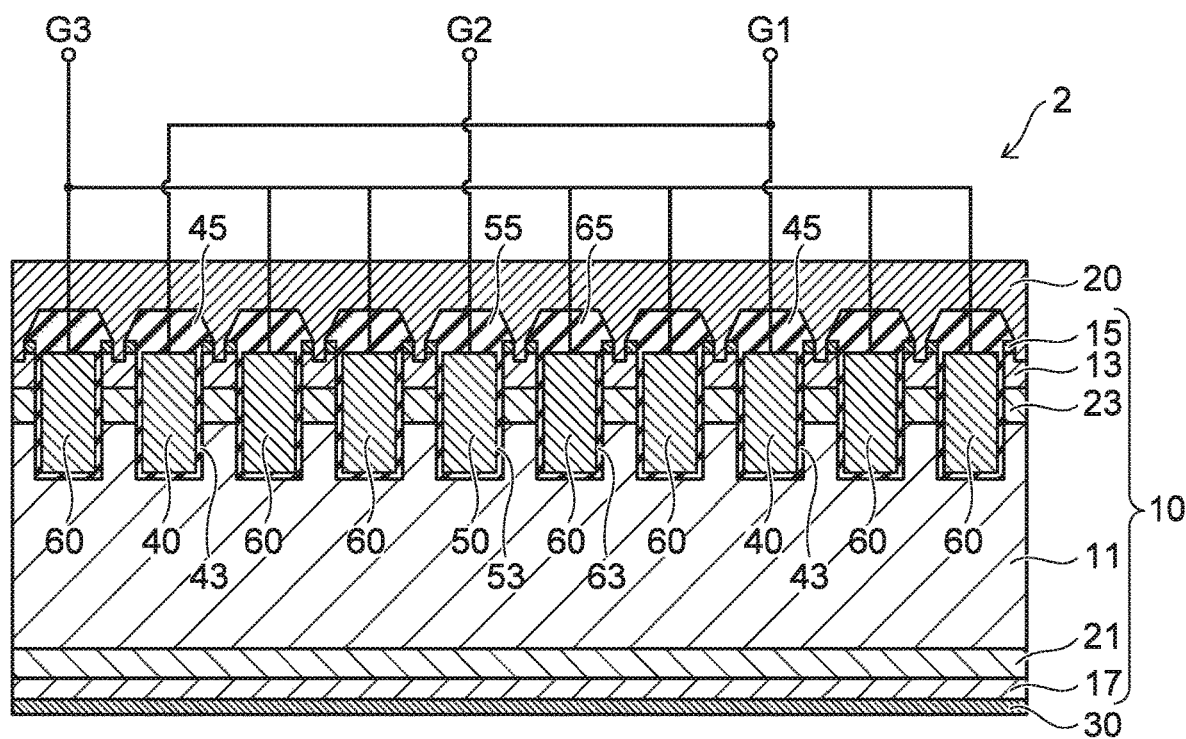
FIG. 8 is a schematic cross-sectional view showing a semiconductor device according to a second embodiment.

FIG. 8 is a schematic cross-sectional view showing a semiconductor device 2 according to a second embodiment. In the semiconductor device 2, for example, the first control electrode 40 and the second control electrode 50 are alternately disposed in a direction along the front surface of the semiconductor part 10. Two third control electrodes 60 are disposed in each region between the first control electrode 40 and the second control electrode 50.

In the semiconductor device 2, the number of the third control electrodes 60 is 2 times the number of the first control electrodes 40 and 2 times the number of the second control electrodes 50. Therefore, the parasitic capacitance between the gate terminal G3 and the first electrode 20 is, for example, greater than the parasitic capacitance between the gate terminal G1 and the first electrode 20. The parasitic capacitance between the gate terminal G3 and the first electrode 20 is, for example, greater than the parasitic capacitance between the gate terminal G2 and the first electrode 20.

Figure 9:
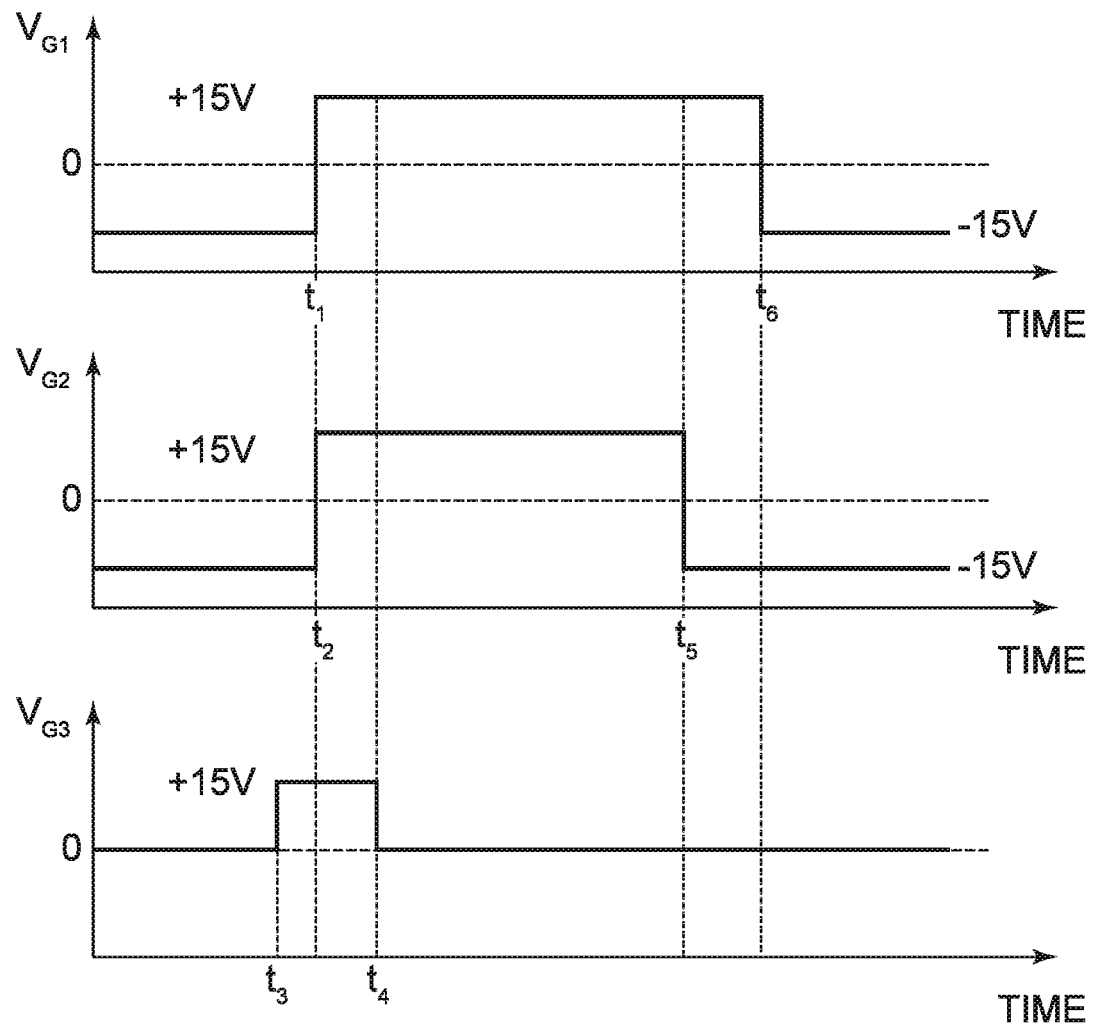
FIG. 9 is a time chart showing a method for controlling the semiconductor device according to the second embodiment.

FIG. 9 is a time chart showing a method for controlling the semiconductor device 2.

In the control method shown in FIG. 9, the first control voltage $V_{G1}$ and the second control voltage $V_{G2}$ are increased from negative 15 V to positive 15 V at the first timing $t_1$ and the second timing $t_2$. The third control voltage $V_{G3}$ is controlled to increase from 0 V to positive 15 V at the third timing $t_3$ and decrease from positive 15 V to 0 V at the fourth timing $t_4$.

As shown in FIG. 9, the first timing $t_1$ and the second timing $t_2$ are simultaneous, and the third timing $t_3$ is set to be before the first and second timings $t_1$ and $t_2$.

In such a case, the difference between the on-voltage and the off-voltage for the third control voltage $V_{G3}$ is less than the difference between the on-voltage and the off-voltage for the first control voltage $V_{G1}$ and the second control voltage $V_{G2}$. However, because the parasitic capacitance between the gate terminal G3 and the first electrode 20 is large, the rise delay of the potential of the third control electrode 60 is greater than $\Delta t_{ON}$ shown in FIG. 5. Accordingly, the third timing $t_3$ is set to be before the first and second timings $t_1$ and $t_2$ so that the potentials of the first to third control electrodes 40, 50, and 60 simultaneously reach the threshold voltages.

Third Embodiment

Figure 10:
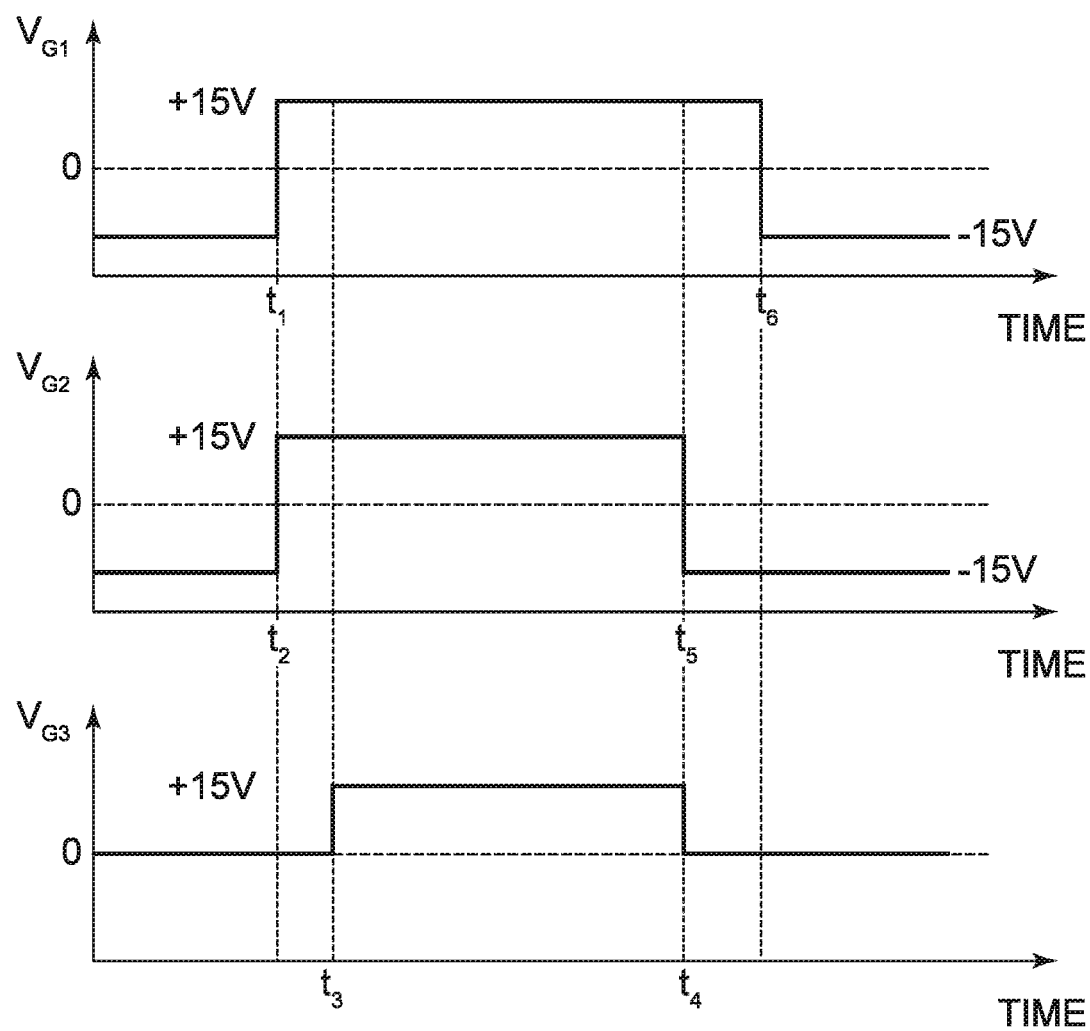
FIG. 10 is a time chart showing a method for controlling the semiconductor device 1 according to a third embodiment.

FIG. 10 is a time chart showing a method for controlling the semiconductor device 1 according to a third embodiment.

In the control method shown in FIG. 10, the first control voltage $V_{G1}$ and the second control voltage $V_{G2}$ are increased from negative 15 V to positive 15 V at the first timing $t_1$ and the second timing $t_2$. The second control voltage $V_{G2}$ is reduced from positive 15 V to negative 15 V at the fifth timing $t_5$. Subsequently, the first control voltage $V_{G1}$ is reduced from positive 15 V to negative 15 V at the sixth timing $t_6$. The first timing $t_1$ and the second timing $t_2$ are, for example, simultaneous.

The third control voltage $V_{G3}$ is controlled to increase from 0 V to positive 15 V at the third timing $t_3$ and to decrease from positive 15 V to 0 V at the fourth timing $t_4$. The third timing $t_3$ is set to be after the first and second timings $t_1$ and $t_2$. For example, the fourth timing $t_4$ is set to be simultaneous with the fifth timing $t_5$.

In the example as well, the turn-on loss can be reduced by causing the potentials of the first control electrode 40, the second control electrode 50, and the third control electrode 60 to simultaneously reach the threshold voltages at turn-on of the semiconductor device 1.

In the on-state between the third timing $t_3$ and the fourth timing $t_4$, electrons are injected into the first layer 11 via the first-conductivity-type inversion layers NIV induced by the first to third control electrodes 40, 50, and 60; and the carrier density in the first layer 11 is increased (referring to FIG. 3A). The on-resistance of the semiconductor device 1 can be reduced thereby.

Figure 11:
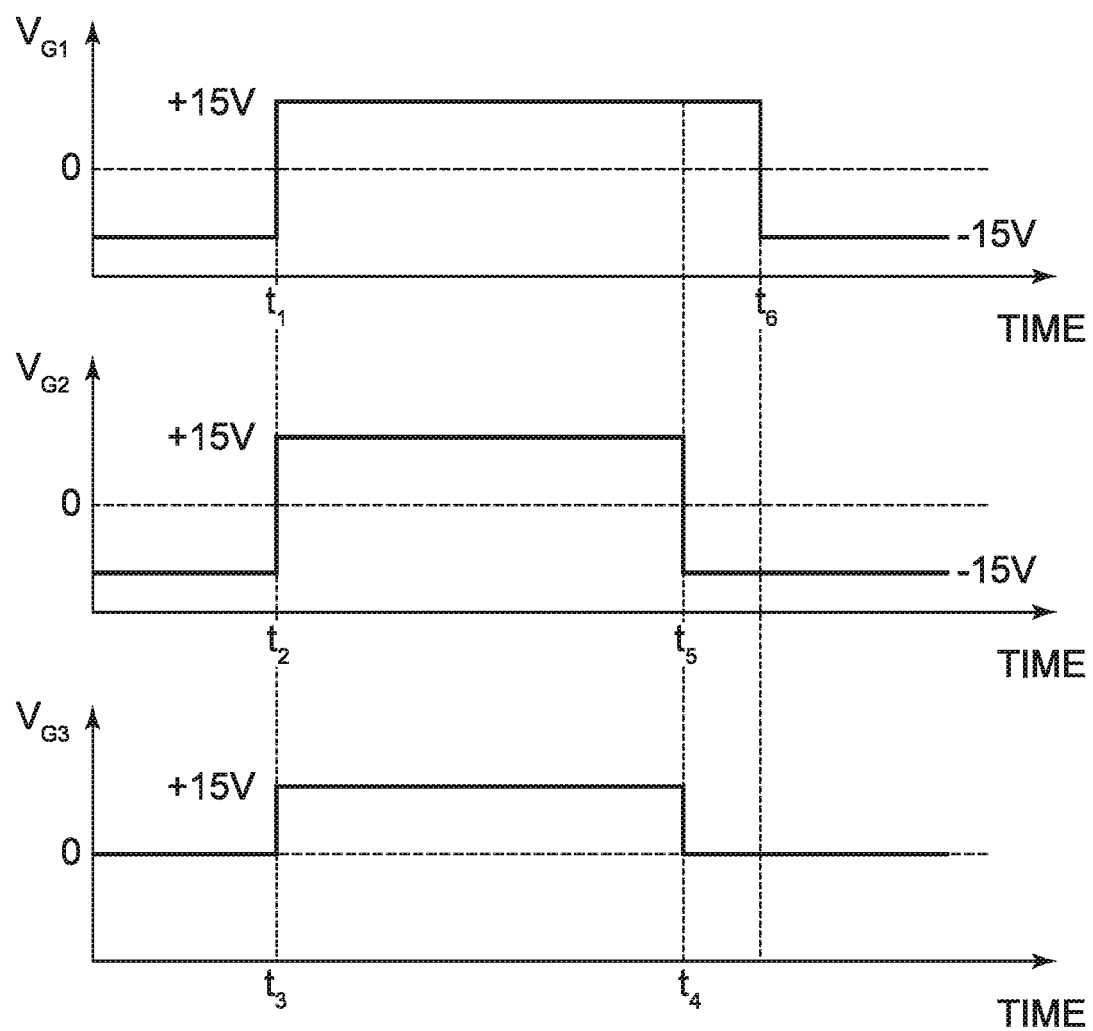
FIG. 11 is a time chart showing a method for controlling the semiconductor device according to a modification of the third embodiment.

FIG. 11 is a time chart showing a method for controlling the semiconductor device 1 according to a modification of the third embodiment.

In the control method shown in FIG. 11, the first control voltage $V_{G1}$ and the second control voltage $V_{G2}$ are increased from negative 15 V to positive 15 V at the first timing $t_1$ and the second timing $t_2$, and the second control voltage $V_{G2}$ is reduced from positive 15 V to negative 15 V at the fifth timing $t_5$. Subsequently, the first control voltage $V_{G1}$ is reduced from positive 15 V to negative 15 V at the sixth timing $t_6$.

The third control voltage $V_{G3}$ is controlled to increase from 0 V to positive 15 V at the third timing $t_3$, which is simultaneous with the first and second timings $t_1$ and $t_2$, and to decrease from positive 15 V to 0 V at the fourth timing $t_4$, which is simultaneous with the fifth timing $t_5$.

In the example, the parasitic capacitance between the first electrode 20 and the third control electrode 60 is greater than the parasitic capacitance between the first electrode 20 and the first control electrode 40 and the parasitic capacitance between the first electrode 20 and the second control electrode 50, and $\Delta t_{ON}$ shown in FIG. 5 cancels with the rise delay of the potential caused by the parasitic capacitance of the third control electrode 60.

For example, the control method shown in FIGS. 10 and 11 is used when the on-resistance of the semiconductor device 1 cannot be sufficiently reduced by a control of switching off the third control electrode 60 and injecting electrons into the first layer 11 via the inversion layers NIV induced by the first control electrode 40 and the second control electrode 50 in the on-state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for controlling a semiconductor device, the semiconductor device including:
    a first electrode;
    a second electrode facing the first electrode;
    a semiconductor part provided between the first electrode and the second electrode; and
    first to third control electrodes provided between the semiconductor part and the first electrode, the first to third control electrodes being electrically insulated from the semiconductor part and the first electrode and electrically isolated from each other, a number of the third control electrodes being greater than a number of the first control electrodes and a number of the second control electrode,
    the semiconductor part including a first layer of a first conductivity type, a second layer of a second conductivity type, a third layer of the first conductivity type, and a fourth layer of the second conductivity type, the first to third control electrodes extending in the first layer from a front surface side of the semiconductor part, the second layer being provided between the first layer and the first electrode, the third layer being selectively provided between the second layer and the first electrode, the third layer being electrically connected to the first electrode, the fourth layer being provided between the first layer and the second electrode, the fourth layer being electrically connected to the second electrode, the method comprising:

applying a first control voltage between the first control electrodes and the first electrode, the first control voltage being a first off-voltage that is less than a first threshold voltage of the first control electrodes;

applying a second control voltage between the second control electrode and the first electrode, the second control voltage being a second off-voltage that is less than a second threshold voltage of the second control electrode;

applying a third control voltage between the third control electrodes and the first electrode, the third control voltage being a third off-voltage that is less than a third threshold voltage of the third control electrodes;

increasing the first control voltage from the first off-voltage to a first on-voltage at a first timing, the first on-voltage being greater than the first threshold voltage;

increasing the second control voltage from the second off-voltage to a second on-voltage at a second timing, the second on-voltage being greater than the second threshold voltage;

increasing the third control voltage from the third off-voltage to a third on-voltage at a third timing before the first timing and the second timing, the third on-voltage being greater than the third threshold voltage;

reducing the third control voltage from the third on-voltage to a lower level than the third threshold voltage at a fourth timing after the first to third timings;

reducing the second control voltage from the second on-voltage to a lower level than the second threshold voltage at a fifth timing after the fourth timing; and reducing the first control voltage from the first on-voltage to a lower level than the first threshold voltage at a sixth timing after the fifth timing.

2. The method according to claim 1, wherein
the third control voltage is reduced to the third off-voltage at the fourth timing,
the second control voltage is reduced to the second off-voltage at the fifth timing, and
the second control voltage is reduced to the first off-voltage at the sixth timing.

3. The method according to claim 1, wherein
a difference between the first on-voltage and the first off-voltage is equal to a difference between the second on-voltage and the second off-voltage, and
the first timing and the second timing are simultaneous.

4. The method according to claim 1, wherein
a difference between the third on-voltage and the third off-voltage is less than a difference between the first on-voltage and the first off-voltage and less than a difference between the second on-voltage and the second off-voltage.

5. The method according to claim 4, wherein
the first electrode is maintained at a first potential, the first potential being less than a second potential of the second electrode,
a potential of the first control electrodes is changed from a lower level than the first potential to a higher level than the first potential at the first timing,
a potential of the second control electrode is changed from a lower level than the first potential to a higher level than the first potential at the second timing, and
a potential of the third control electrodes is changed from a same level as the first potential to a higher level than the first potential at the third timing.

6. The method according to claim 1, wherein
a period between the second timing and the fifth timing and a period between the fourth timing and the fifth timing are greater than a period between the fifth timing and the sixth timing.

7. The method according to claim 1, wherein
the first to third on-voltages are equal.

8. The method according to claim 1, wherein
the first off-voltage and the second off-voltage are equal.

9. A method for controlling a semiconductor device, the semiconductor device including:
a first electrode;
a second electrode facing the first electrode;
a semiconductor part provided between the first electrode and the second electrode; and
first to third control electrodes provided between the semiconductor part and the first electrode, the first to third control electrodes being electrically insulated from the semiconductor part and the first electrode and electrically isolated from each other,
the semiconductor part including a first layer of a first conductivity type, a second layer of a second conductivity type, a third layer of the first conductivity type, and a fourth layer of the second conductivity type,
the first to third control electrodes extending in the first layer from a front surface side of the semiconductor part,
the second layer being provided between the first layer and the first electrode,
the third layer being selectively provided between the second layer and the first electrode and electrically connected to the first electrode,
the fourth layer being provided between the first layer and the second electrode and electrically connected to the second electrode,
the method comprising:
applying a first control voltage between the first control electrode and the first electrode, the first control voltage being a first off-voltage that is less than a first threshold voltage of the first control electrode;
applying a second control voltage between the second control electrode and the first electrode, the second control voltage being a second off-voltage that is less than a second threshold voltage of the second control electrode;
applying a third control voltage between the third control electrode and the first electrode, the third control voltage being a third off-voltage that is less than a third threshold voltage of the third control electrode, increasing the first control voltage from the first off-voltage to a first on-voltage at a first timing, the first on-voltage being greater than the first threshold voltage;

increasing the second control voltage from the second off-voltage to a second on-voltage at a second timing, the second on-voltage being greater than the second threshold voltage;

increasing the third control voltage from the third off-voltage to a third on-voltage at a third timing before the first timing and the second timing, the third on-voltage being greater than the second threshold voltage;

reducing the third control voltage from the third on-voltage to a lower level than the third threshold voltage at a fourth timing after the first to third timings;

reducing the second control voltage from the second on-voltage to a lower level than the second threshold voltage at a fifth timing after the first to third timings; and reducing the first control voltage from the first on-voltage to a lower level than the first threshold voltage at a sixth timing after the fourth and fifth timings, a difference between the third on-voltage and the third off-voltage being less than a difference between the first on-voltage and the first off-voltage and less than a difference between the second on-voltage and the second off-voltage.

10. The method according to claim 9, wherein
the third control voltage is reduced from the third on-voltage to the third off-voltage at the fourth timing,
the second control voltage is reduced from the second on-voltage to the second off-voltage at the fifth timing, and
the first control voltage is reduced from the first on-voltage to the first off-voltage at the sixth timing.

11. The method according to claim 9, wherein
the fourth timing and the fifth timing are simultaneous.

12. The method according to claim 9, wherein
a difference between the first on-voltage and the first off-voltage is equal to a difference between the second on-voltage and the second off-voltage, and
the first timing and the second timing are simultaneous.

13. The method according to claim 9, wherein
the first electrode is maintained at a first potential, the first potential being less than a second potential of the second electrode,
a potential of the first control electrode is changed from a lower level than the first potential to a higher level than the first potential at the first timing,
a potential of the second control electrode is changed from a lower level than the first potential to a higher level than the first potential at the second timing, and
a potential of the third control electrode is changed from a same level as the first potential to a higher level than the first potential at the third timing.

* * * * *